(12) United States Patent
Noguchi

(10) Patent No.: US 11,356,081 B2
(45) Date of Patent: Jun. 7, 2022

(54) AVERAGE INTERVAL GENERATOR

(71) Applicant: MICRON TECHNOLOGY, INC., Boise, ID (US)

(72) Inventor: Hidekazu Noguchi, Shinjuku-ku (JP)

(73) Assignee: Micron Technology, Inc., Boise, ID (US)

( * ) Notice: Subject to any disclaimer, the term of this patent is extended or adjusted under 35 U.S.C. 154(b) by 461 days.

(21) Appl. No.: 16/563,334

(22) Filed: Sep. 6, 2019

(65) Prior Publication Data

US 2021/0075408 A1    Mar. 11, 2021

(51) Int. Cl.
*H03K 3/84* (2006.01)
*G11C 11/406* (2006.01)

(52) U.S. Cl.
CPC .......... *H03K 3/84* (2013.01); *G11C 11/40618* (2013.01)

(58) Field of Classification Search
None
See application file for complete search history.

(56) References Cited

U.S. PATENT DOCUMENTS

| | | | | |
|---|---|---|---|---|
| 6,584,162 | B1 * | 6/2003 | Tinker | H03H 17/0671 370/545 |
| 7,567,641 | B2 * | 7/2009 | Kamath | G11B 20/10037 329/346 |
| 9,431,085 | B2 * | 8/2016 | Greenberg | G11C 11/406 |
| 9,608,508 | B2 * | 3/2017 | Darshan | H02M 3/155 |
| 9,818,469 | B1 * | 11/2017 | Kim | G11C 11/4076 |
| 2018/0158507 | A1 * | 6/2018 | Bang | G11C 16/3418 |
| 2019/0347019 | A1 * | 11/2019 | Shin | G06F 3/0622 |

* cited by examiner

*Primary Examiner* — Amy Cohen Johnson
*Assistant Examiner* — James H Cho
(74) *Attorney, Agent, or Firm* — Dorsey & Whitney LLP

(57) ABSTRACT

Disclosed herein is an apparatus that includes a first circuit configured to generate a first signal a first number of times in response to an input signal, a second circuit configured to generate a second signal having a second numerical value each time the first signal is activated, and a third circuit configured to receive the second signal to update a count value obtained by accumulating the second numerical value, configured to generate a third signal each time the count value reaches a third numerical value, and configured to update the count value obtained by accumulating the second numerical value and subtracting the third numerical value when the count value reached the third numerical value.

20 Claims, 16 Drawing Sheets

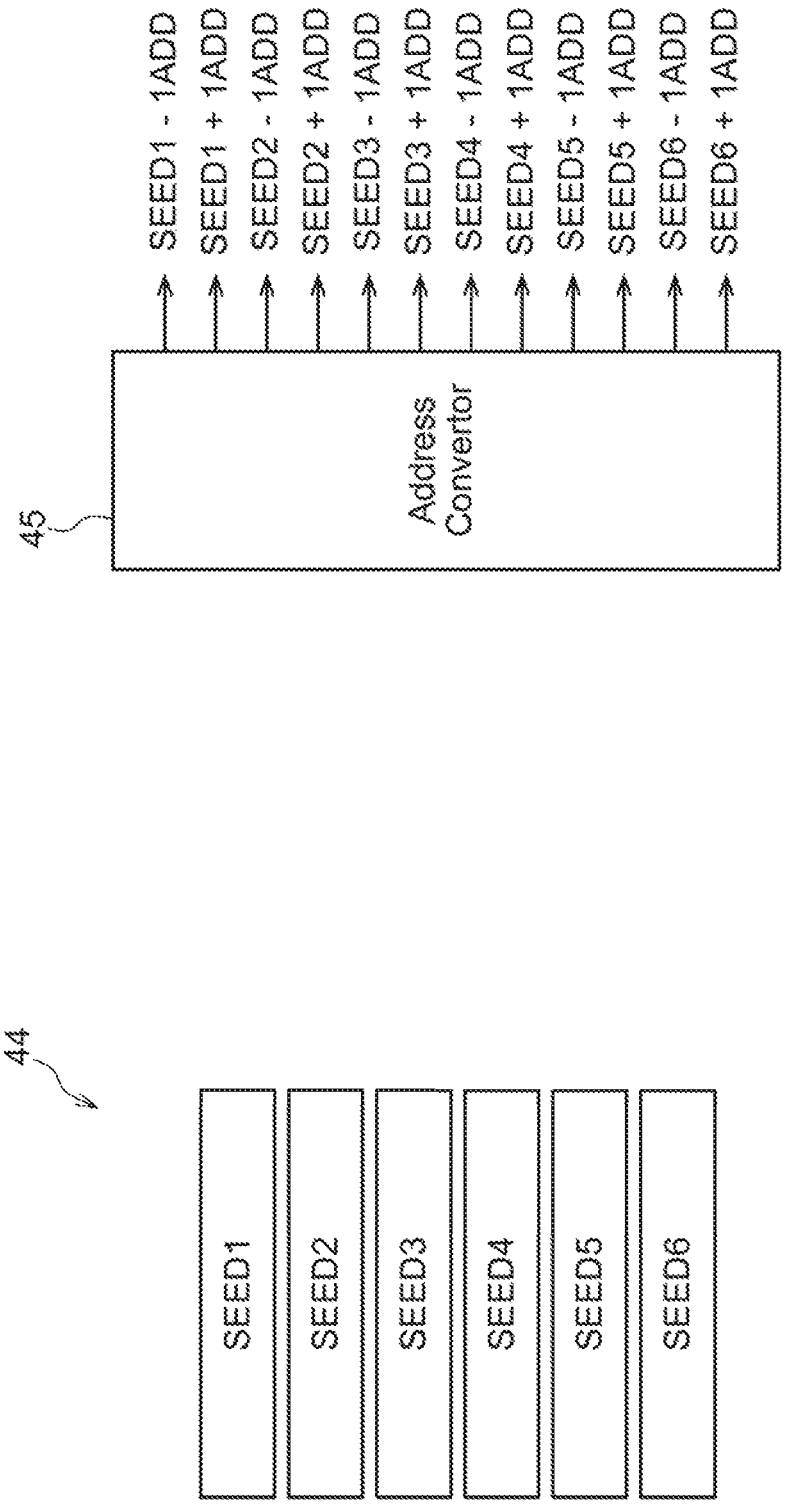

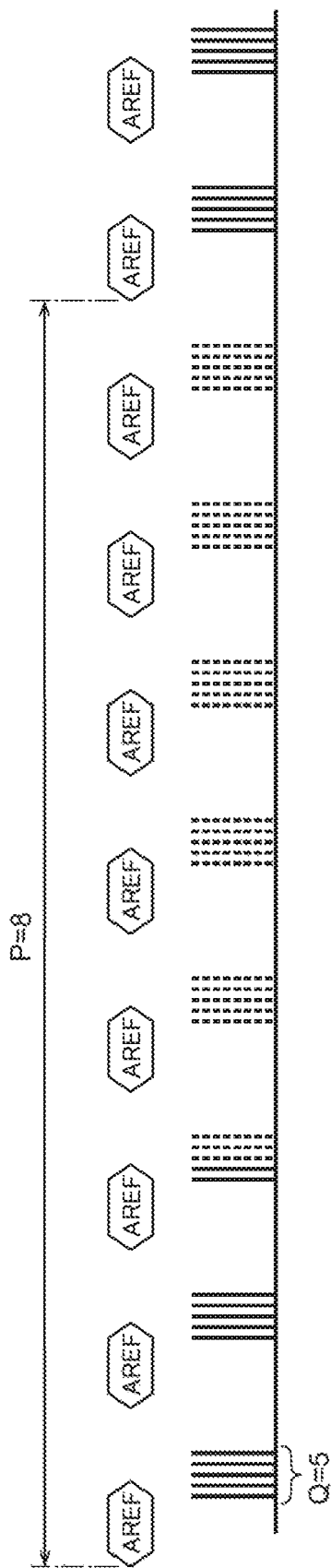
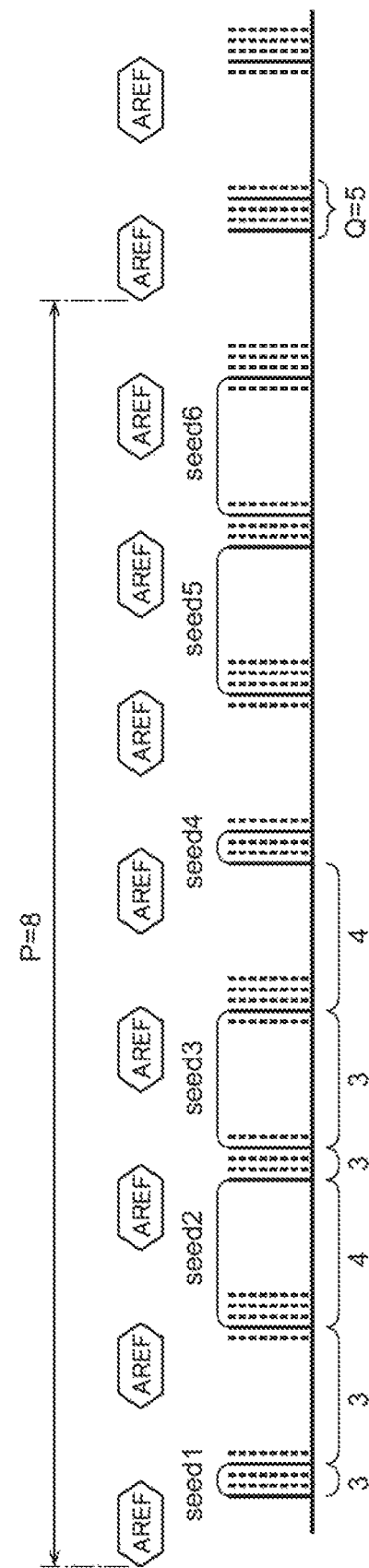
FIG. 4A
FIG. 4B

| AREF | IREF | Count | |
|---|---|---|---|
| 1 | 1 | 12 | |
| | 2 | 24 | |
| | 3 | 36 | |
| | 4 | 8 | →RHR |
| | 5 | 20 | |
| 2 | 6 | 32 | |
| | 7 | 4 | →RHR |
| | 8 | 16 | |
| | 9 | 28 | |
| | 10 | 0 | →RHR |
| 3 | 11 | 12 | |
| | 12 | 24 | |
| | 13 | 36 | |
| | 14 | 8 | →RHR |
| | 15 | 20 | |
| 4 | 16 | 32 | →RHR |
| | 17 | 4 | |
| | 18 | 16 | |
| | 19 | 28 | |
| | 20 | 0 | →RHR |
| 5 | 21 | 12 | |
| | 22 | 24 | |
| | 23 | 36 | |
| | 24 | 8 | →RHR |
| | 25 | 20 | |
| 6 | 26 | 32 | |
| | 27 | 4 | →RHR |
| | 28 | 16 | |
| | 29 | 28 | |
| | 30 | 0 | →RHR |
| 7 | 31 | 12 | |
| | 32 | 24 | |
| | 33 | 36 | |
| | 34 | 8 | →RHR |
| | 35 | 20 | |
| 8 | 36 | 32 | |
| | 37 | 4 | →RHR |
| | 38 | 16 | |
| | 39 | 28 | |
| | 40 | 0 | →RHR |

FIG. 8A

| AREF | IREF | Count |     |
|------|------|-------|-----|
| 1    | 1    | 12    |     |
|      | 2    | 24    |     |
|      | 3    | 36    |     |
|      | 4    | 3     | →RHR |
|      | 5    | 15    |     |
| 2    | 6    | 27    |     |
|      | 7    | 39    |     |
|      | 8    | 6     | →RHR |
|      | 9    | 18    |     |
|      | 10   | 30    |     |
| 3    | 11   | 42    |     |
|      | 12   | 9     | →RHR |
|      | 13   | 21    |     |
|      | 14   | 33    |     |
|      | 15   | 0     | →RHR |
| 4    | 16   | 12    |     |
|      | 17   | 24    |     |
|      | 18   | 36    |     |
|      | 19   | 3     | →RHR |
|      | 20   | 15    |     |
| 5    | 21   | 27    |     |
|      | 22   | 39    |     |
|      | 23   | 6     | →RHR |
|      | 24   | 18    |     |
|      | 25   | 30    |     |
| 6    | 26   | 42    |     |
|      | 27   | 9     | →RHR |
|      | 28   | 21    |     |
|      | 29   | 33    |     |
|      | 30   | 0     | →RHR |
| 7    | 31   | 12    |     |
|      | 32   | 24    |     |
|      | 33   | 36    |     |
|      | 34   | 3     | →RHR |
|      | 35   | 15    |     |
| 8    | 36   | 27    |     |
|      | 37   | 39    |     |
|      | 38   | 6     | →RHR |
|      | 39   | 18    |     |
|      | 40   | 30    |     |
| 9    | 41   | 42    |     |
|      | 42   | 9     | →RHR |
|      | 43   | 21    |     |
|      | 44   | 33    |     |
|      | 45   | 0     | →RHR |

FIG. 8B

| AREF | IREF | Count1 | Count2 |      |
|------|------|--------|--------|------|
| 1    | 1    | 4      | 1      |      |
|      | 2    | 0      | 3      |      |
|      | 3    | 4      | 4      |      |
|      | 4    | 0      | 1      | →RHR |
|      | 5    | 4      | 2      |      |
| 2    | 6    | 0      | 4      |      |
|      | 7    | 4      | 0      | →RHR |
|      | 8    | 0      | 2      |      |
|      | 9    | 4      | 3      |      |
|      | 10   | 0      | 0      | →RHR |
| 3    | 11   | 4      | 1      |      |
|      | 12   | 0      | 3      |      |
|      | 13   | 4      | 4      |      |
|      | 14   | 0      | 1      | →RHR |
|      | 15   | 4      | 2      |      |
| 4    | 16   | 0      | 4      |      |
|      | 17   | 4      | 0      | →RHR |
|      | 18   | 0      | 2      |      |
|      | 19   | 4      | 3      |      |
|      | 20   | 0      | 0      | →RHR |
| 5    | 21   | 4      | 1      |      |
|      | 22   | 0      | 3      |      |
|      | 23   | 4      | 4      |      |
|      | 24   | 0      | 1      | →RHR |
|      | 25   | 4      | 2      |      |
| 6    | 26   | 0      | 4      |      |
|      | 27   | 4      | 0      | →RHR |
|      | 28   | 0      | 2      |      |
|      | 29   | 4      | 3      |      |
|      | 30   | 0      | 0      | →RHR |
| 7    | 31   | 4      | 1      |      |
|      | 32   | 0      | 3      |      |
|      | 33   | 4      | 4      |      |
|      | 34   | 0      | 1      | →RHR |
|      | 35   | 4      | 2      |      |
| 8    | 36   | 0      | 4      |      |
|      | 37   | 4      | 0      | →RHR |
|      | 38   | 0      | 2      |      |
|      | 39   | 4      | 3      |      |
|      | 40   | 0      | 0      | →RHR |

Rows 1–4 grouped as 4; rows 5–7 grouped as 3; rows 8–10 grouped as 3.

FIG. 10A

| AREF | IREF | Count1 | Count2 | |
|---|---|---|---|---|
| 1 | 1 | 3 | 1 | |
| | 2 | 6 | 2 | |
| | 3 | 0 | 4 | |
| | 4 | 3 | 0 | →RHR |
| | 5 | 6 | 1 | |
| 2 | 6 | 0 | 3 | |
| | 7 | 3 | 4 | |
| | 8 | 6 | 0 | →RHR |
| | 9 | 0 | 2 | |
| | 10 | 3 | 3 | |
| 3 | 11 | 6 | 4 | |
| | 12 | 0 | 1 | →RHR |
| | 13 | 3 | 2 | |
| | 14 | 6 | 3 | |
| | 15 | 0 | 0 | →RHR |
| 4 | 16 | 3 | 1 | |
| | 17 | 6 | 2 | |
| | 18 | 0 | 4 | |
| | 19 | 3 | 0 | →RHR |
| | 20 | 6 | 1 | |
| 5 | 21 | 0 | 3 | |
| | 22 | 3 | 4 | |
| | 23 | 6 | 0 | →RHR |
| | 24 | 0 | 2 | |
| | 25 | 3 | 3 | |
| 6 | 26 | 6 | 4 | |
| | 27 | 0 | 1 | →RHR |
| | 28 | 3 | 2 | |
| | 29 | 6 | 3 | |
| | 30 | 0 | 0 | →RHR |
| 7 | 31 | 3 | 1 | |
| | 32 | 6 | 2 | |
| | 33 | 0 | 4 | |
| | 34 | 3 | 0 | →RHR |
| | 35 | 6 | 1 | |
| 8 | 36 | 0 | 3 | |
| | 37 | 3 | 4 | |
| | 38 | 6 | 0 | →RHR |
| | 39 | 0 | 2 | |
| | 40 | 3 | 3 | |
| 9 | 41 | 6 | 4 | |
| | 42 | 0 | 1 | →RHR |
| | 43 | 3 | 2 | |
| | 44 | 6 | 3 | |
| | 45 | 0 | 0 | →RHR |

FIG. 10B

AVERAGE INTERVAL GENERATOR

BACKGROUND

When accesses are concentrated on a same word line in a semiconductor device such as a DRAM (Dynamic Random Access Memory) information storing characteristics of memory cells connected to adjacent word lines may decrease. Accordingly, to prevent information in the memory cells connected to the adjacent word lines from being lost, a refresh operation of the relevant memory cells is additionally performed in addition to a normal refresh operation in some cases. This additional refresh operation is referred to as "row hammer refresh". Because a row hammer refresh operation interrupts a normal refresh operation a timing at which the row hammer refresh operation is to be performed becomes a problem.

BRIEF DESCRIPTION OF THE DRAWINGS

FIG. 3A is a block diagram showing an example of a row hammer address storing circuit.

FIG. 3B is a diagram showing an example of a signal output from an address converter.

FIGS. 4A and 4B are timing charts showing an example in which 12 row hammer refresh operations are performed during a period in which an internal refresh signal is activated 40 times.

FIGS. 8A and 8B are tables showing a relation between the number of occurrences of the internal refresh signal and a count value in a case where the average interval generator shown in FIG. 6 is used.

FIGS. 10A and 10B are tables showing a relation between the number of occurrences of the internal refresh signal and the count value in a case where the average interval generator shown in FIG. 9 is used.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein an not necessary mutually exclusive, as some disclosed embodiments can be combined with one or more other disclosed embodiments to form new embodiments.

Figure 1:
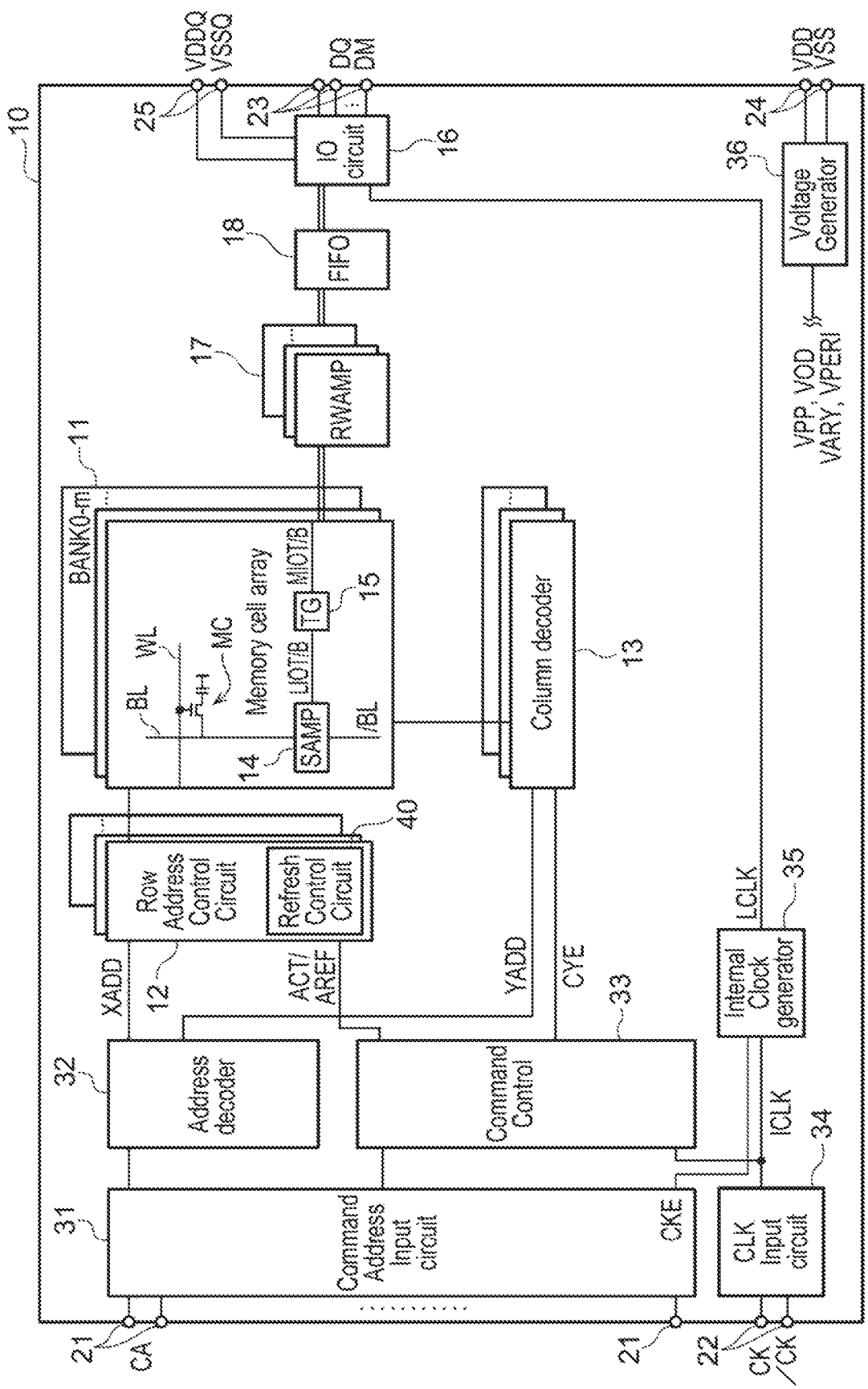
FIG. 1 is a block diagram of a semiconductor device according to an embodiment of the present disclosure.

FIG. 1 is a block diagram of a semiconductor device 10 according to an embodiment of the present disclosure. The semiconductor device 10 may be a LPDDR4 SDRAM incorporated in a single semiconductor chip, for example. The semiconductor device 10 may be mounted on an external substrate, for example, a memory module substrate or a mother board. As shown in FIG. 1, the semiconductor device 10 includes a memory cell array 11. The memory cell array 11 includes a plurality of word lines WL, a plurality of bit lines BL, and a plurality of memory cells MC arranged at intersections of the word lines WL and the bit lines BL. Selection of a word line WL is performed by a row address control circuit 12, and selection of a bit line BL is performed by a column decoder 13. A sense amplifier 14 is connected to a corresponding bit line BL and a pair of local I/O lines LIOT/B. The pair of local I/O lines LIOT/B is connected to a pair of main I/O lines MIOT/B via a transfer gate 15 functioning as a switch. The memory cell array 11 is divided into (m+1) memory banks including memory banks BANK0 to BANKm.

A plurality of external terminals included in the semiconductor device 10 include command address terminals 21, clock terminals 22, data terminals 23, and power-supply terminals 24 and 25. The data terminals 23 are connected to an I/O circuit 16.

A command address signal CA is supplied to the command address terminals 21. One of the command address signals CA supplied to the command address terminals 21, which relates to an address, is transferred to an address decoder 32 via a command address input circuit 31. Another one that relates to a command is transferred to a command control circuit 33 via the command address input circuit 31. The address decoder 32 decodes an address signal and generates a row address XADD and a column address YADD. The row address XADD is supplied to the row address control circuit 12, and the column address YADD is supplied to the column decoder 13. Further, a command address signal CA that functions as a clock enable signal CKE is supplied to an internal clock generator 35.

Complementary external clock signals CK and/CK are supplied to the clock terminals 22. The complementary external clock signals CK and CK are input to a clock input circuit 34. The clock input circuit 34 generates an internal clock signal ICLK based on the complementary external clock signals CK and CK. The internal clock signal ICLK is supplied to at least the command control circuit 33 and the internal clock generator 35. The internal clock generator 35 is activated by the clock enable signal CKE, for example, and generates an internal clock signal LCLK based on the internal clock signal ICLK. The internal clock signal LCLK is supplied to the I/O circuit 16. The internal clock signal LCLK is used as a timing signal that defines a timing at which read data DQ is output from the data terminal 23 at the time of a read operation. In a write operation, write data is input to the data terminal 23 from outside. In the write operation, a data mask signal DM may be input to the data terminal 23 from outside.

Power-supply potentials VDD and VSS are supplied to the power-supply terminals 24. These power-supply potentials VDD and VSS are supplied to a voltage generator 36. The voltage generator 36 generates various internal potentials VPP, VOD, VARY, and VPERI, for example, based on the power-supply potentials VDD and VSS. The internal potential VPP is used mainly in the row address control circuit 12. The internal potentials VOD and VARY are used mainly in the sense amplifier 14 included in the memory cell army 11. The internal potential VPERI is used in many other circuit blocks.

Power-supply potentials VDDQ and VSSQ are supplied to the I/O circuit 16 from the power-supply terminals 25. Although the power-supply potentials VDDQ and VSSQ may be the same potentials as the power-supply potentials VDD and VSS supplied to the power supply terminals 24, respectively, the dedicated power-supply potentials VDDQ and VSSQ are assigned to the I/O circuit 16 in order to prevent propagation of power-supply noise generated in the I/O circuit 16 to another circuit block.

The command control circuit 33 activates an active signal ACT when an active command is issued, and activates a refresh signal AREF when a refresh command is issued. The active signal ACT and the refresh signal AREF are both supplied to the row address control circuit 12. The row address control circuit 12 includes a refresh control circuit 40. The refresh control circuit 40 controls a refresh operation for the memory cell array 11 based on the row address XADD, the active signal ACT, and the refresh signal AREF. The refresh control circuit 40 will be described in detail later.

When a read command is issued from outside, following to the active command, the command control circuit 33 activates a column selection signal CYE. The column selection signal CYE is supplied to the column decoder 13. In response to this signal, read data is read out from the memory cell array 11. The read data read from the memory cell array 11 is transferred to the I/O circuit 16 via a read-write amplifier 17 and an FIFO circuit 18, and is output to outside via the data terminals 23.

Figure 2:
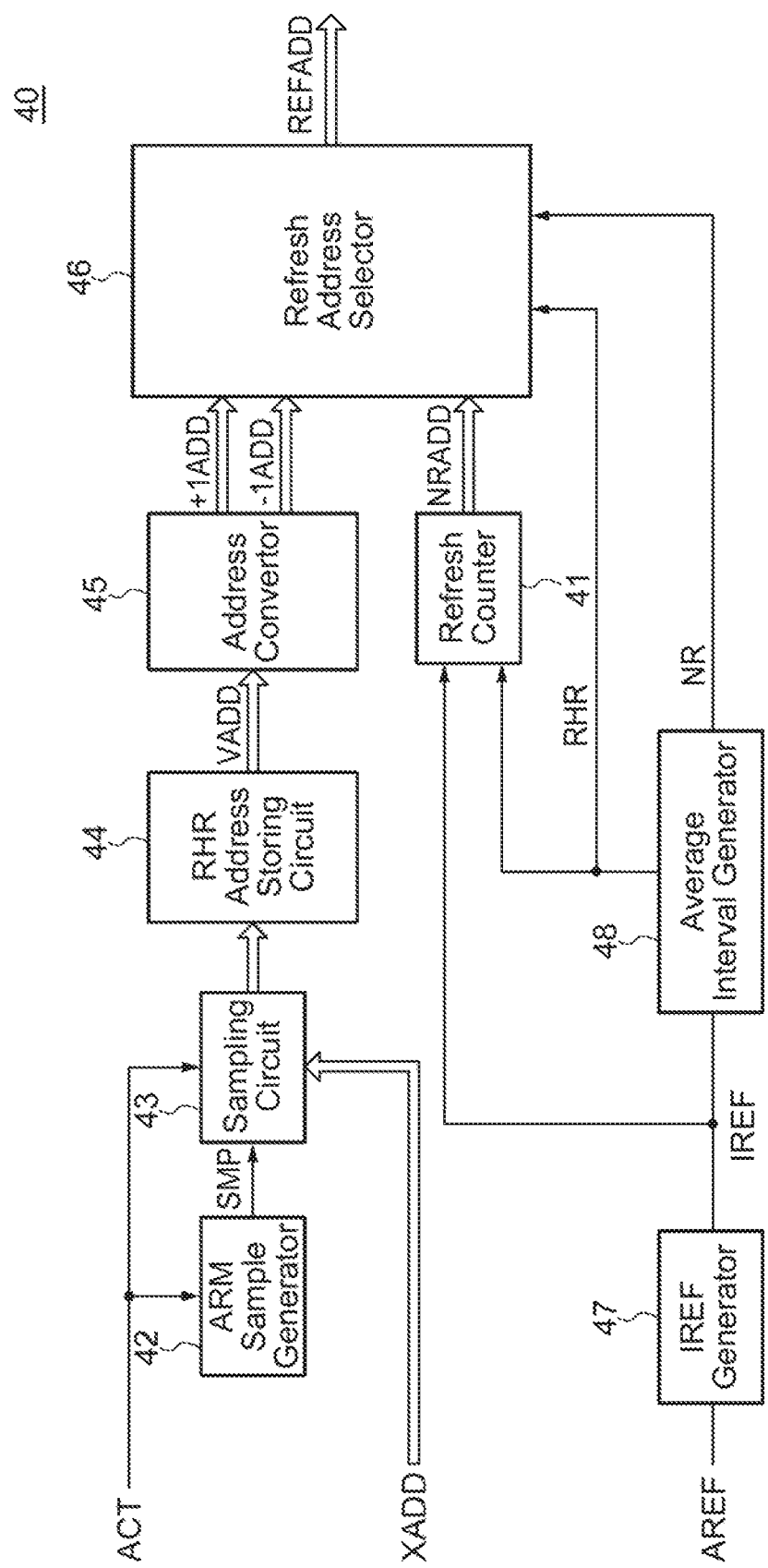
FIG. 2 is a block diagram for explaining a configuration of a refresh control circuit.

FIG. 2 is a block diagram for explaining a configuration of the refresh control circuit 40.

As shown in FIG. 2, the refresh control circuit 40 includes a refresh counter 41, an ARM sample generator 42, a sampling circuit 43, a row hammer address storing circuit 44, an address convertor 45, a refresh address selector 46, an IREF generator 47, and an average interval generator 48. The refresh counter 41 generates a normal refresh address NRADD. The normal refresh address NRADD is incremented or decremented in response to an internal refresh signal IREF. However, when a row hammer refresh signal RHR is activated, the update operation of the refresh counter 41 in response to the internal refresh signal IREF is stopped. The internal refresh signal IREF is generated by the IREF generator 47 and is activated a plurality of times on the basis of the refresh signal AREF. The sampling circuit 43 samples the row address XADD at a timing when a sampling signal SMP generated by the arm sample generator 42 has been activated, and supplies the sampled row address XADD to the row hammer address storing circuit 44. The ARM sample generator 42 may activate the sampling signal SMP at a timing when the active signal ACT has been activated a predetermined number of times. This enables an address VADD of a word line WL on which accesses are concentrated to be supplied to the row hammer address storing circuit 44. The row hammer address stoning circuit 44 stores therein a plurality of row addresses VADD. The row addresses VADD stored in the row hammer address storing circuit 44 are supplied to the address convertor 45. The address convertor 45 converts each of the row addresses VADD to generate row hammer refresh addresses +1ADD and −1ADD. The row hammer refresh addresses +1ADD and −1ADD are addresses of word lines WL adjacent on both sides to a word line WL to which each of the row addresses VADD is assigned. Therefore, the number of row hammer refresh addresses output from the address convertor 45 is twice as large as the number of row addresses VADD stored in the row hammer address storing circuit 44. For example, when six addresses SEED1 to SEED6 are stored in the row hammer address storing circuit 44 as shown in FIG. 3A, the address convertor 45 outputs row hammer refresh addresses +1ADD and −1ADD for each of the addresses SEED1 to SEED6 as shown in FIG. 3B. The normal refresh address NRADD and the row hammer refresh addresses +1ADD and −1ADD are supplied to the refresh address selector 46.

The average interval generator 48 selects whether to perform a normal refresh operation or a row hammer refresh operation. The internal refresh signal IREF is input to the average interval generator 48, and the average internal generator 48 activates either a normal refresh signal NR or the row hammer refresh signal RHR each time the internal refresh signal IREF is activated. The normal refresh signal NR is activated when the normal refresh operation is to be performed, and the row hammer refresh signal RHR is activated when the row hammer refresh operation is to be performed.

In the present embodiment, the row hammer refresh operations am performed in a dispersed manner. The reason is as follows. Because the number of word lines WL selected in a row hammer refresh operation is smaller than that selected in a normal refresh operation, increase and decrease of current consumption are larger when the row hammer refresh operations are performed in a concentrated manner. In examples shown in FIGS. 4A and 4B, the internal refresh signal IREF is activated five times consecutively each time the refresh signal AREF is activated once and 12 row hammer refresh operations are performed each time the refresh signal AREF is activated eight times (P=8 and Q=5). This means that the row hammer refresh operation is performed to a total of 12 row hammer refresh addresses +1ADD and −1ADD corresponding to the six addresses SEED1 to SEED6 stored in the row hammer address storing circuit 44 each time the refresh signal AREF is activated eight times. As a result, each time the internal refresh signal IREF is activated 40 (P×Q) times, 12 row hammer refresh operations are performed and all row hammer refresh operations related to the six addresses SEED1 to SEED6 stored in the row hammer address storing circuit 44 are completed.

In the example shown in FIG. 4A, the 12 row hammer refresh operations are performed in a concentrated mane. That is, the row hammer refresh operations are performed in response to first to 12th internal refresh signals IREF and the normal refresh operations am performed in response to 13th to 40th internal refresh signals REF. In this case, current consumption corresponding to first and second refresh signals AREF decreases while current consumption corresponding to third to eighth refresh signals AREF increases. In contrast thereto, the 12 row hammer refresh operations are performed in a dispersed manner in the example shown in FIG. 4B. To perform the 12 row hammer refresh operations in a completely averaged manner ding a period in which the internal refresh signal IREF is activated 40 times, it suffices to perform the row hammer refresh operation each time the internal refresh signal IREF is activated 3.333 . . . times (=4012) according to calculation. However, a fraction is naturally unacceptable. Therefrom, in the example shown in FIG. 4B, a pattern in which the row hammer refresh operation is performed twice when the internal refresh signal IREF is activated three times and the row hammer refresh operation is performed once when the internal refresh signal IREF is activated four times is caused to appear repeatedly to perform pseudo averaging.

Figure 5A:
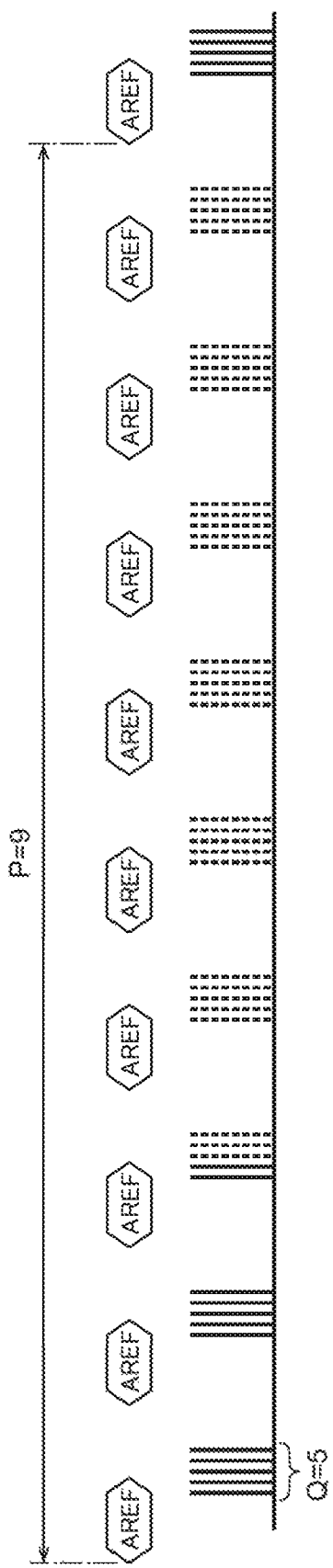
FIGS. 5A and 5B are timing charts showing an example in which 12 tow hammer refresh operations are performed during a period in which the internal refresh signal is activated 45 times.
Figure 5B:
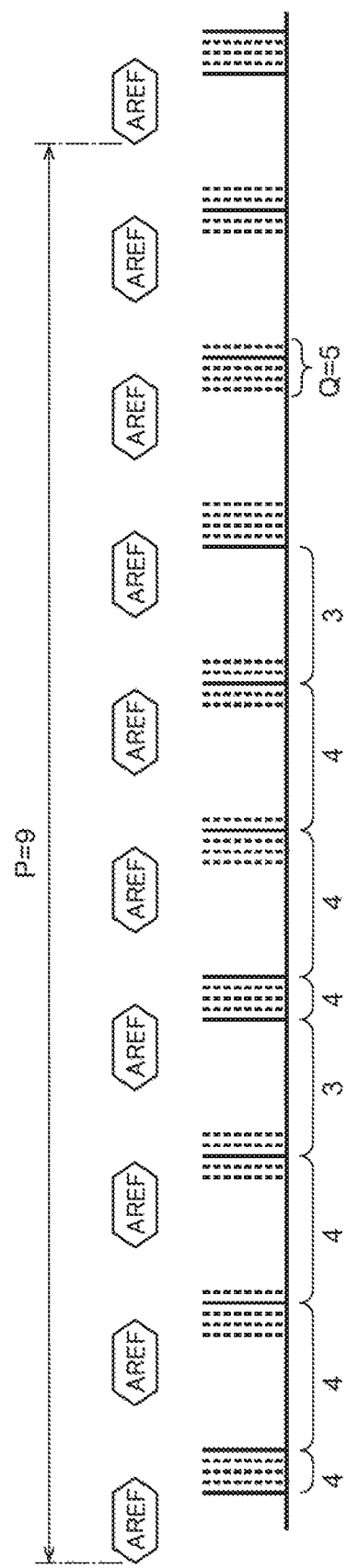

In examples shown in FIGS. 5A and 5B, the internal refresh signal IREF is activated five times consecutively each time the refresh signal AREF is activated once, and 12 row hammer refresh operations are preformed each time the refresh signal AREF is activated nine times (P=9 and Q=5). As a result, each time the internal refresh signal REF is activated 45(=P×Q) times, 12 row hammer refresh operations are performed and all row hammer refresh operations related to the six addresses SEED1 to SEED6 stored in the row hammer address storing circuit 44 are completed.

In the example shown in FIG. 5A, the 12 row hammer refresh operations are performed in a concentrated manner. Tat is, the row hammer refresh operations are performed in response to first to 12th internal refresh signals IREF and the normal refresh operations are performed in response to 13th to 45th internal refresh signals IREF. In contrast thereto, the 12 row hammer refresh operations are performed in a dispersed manner in the example shown in FIG. 5B. To perform the 12 row hammer refresh operations in a completely averaged manner during a period in which the internal refresh signal REF is activated 45 times, it suffices to perform the row hammer refresh operation each time the internal refresh signal IREF is activated 3.75 (=45112) times according to calculation. However, a fraction is naturally unacceptable. Therefore, in the example shown in FIG. 5B, a pattern in which the ow hammer refresh operation is performed three times when the internal refresh signal IREF is activated four times and the row hammer refresh operation is performed once when the internal refresh signal REF is activated three times is caused to appear repeatedly to perform pseudo averaging.

This pseudo averaging is achieved by the average interval generator 48. In an example shown in FIG. 6, the average interval generator 48 is constituted by a pulse generator 50 and a counter circuit 51. The pulse generator 50 generates a pulse signal S0 a plurality of times each time the internal refresh signal IREF is activated. The counter circuit 51 counts the pulse signals S0 and activates the row hammer refresh signal RHR each time the count value reaches a predetermined value. The number of the pulse signals S0 generated by the pulse generator 50 is set to twice as large as the number of addresses SEED stored in the row hammer address storing circuit 44. Therefore, in the examples shown in FIGS. 4B and 5B, the number of the pulse signals S0 is "12". In this case, the pulse generator 50 activates the pulse signal S0 12 times each time the internal refresh signal IREF is activated. The predetermined value set in the counter circuit 51 is P×Q. Therefore, the predetermined value is "40" in the example shown in FIG. 4B and is "45" in the example shown in FIG. 5B.

Figure 7:
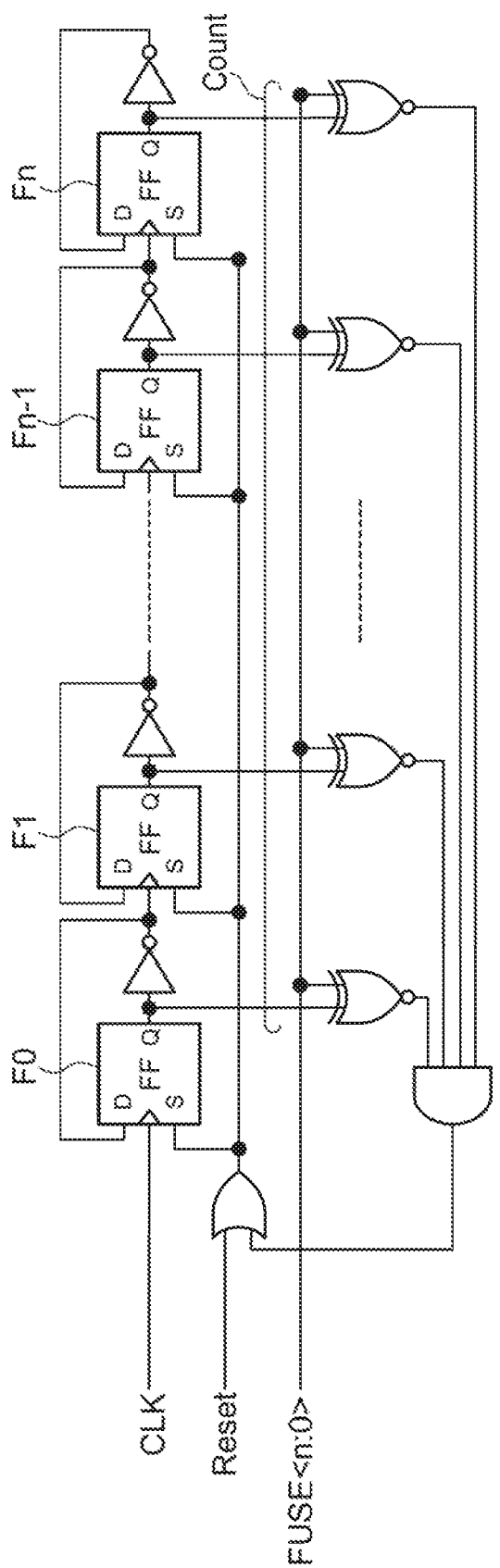
FIG. 7 is a circuit diagram of a counter circuit shown in FIG. 6.

For example, a circuit that uses a (n+1)-bit binary counter using n+1 flip-flop circuits F0 to Fn and resets the count value to zero when the count value reaches the predetermined value (=P×Q) can be used as the counter circuit 51 as shown in FIG. 7. The predetermined value (=P×Q) is defined by a (n+1)-bit fuse signal FUSE<n:0>. The fuse signal FUSE<n:0> is set to a certain value (40 or 45, for example) at a manufacturing step. When the predetermined value in the counter circuit 51 is set to 40, the counter circuit 51 is reset to zero and the row hammer refresh signal RHR is generated each time a count value Count reaches 40 as shown in FIG. 8A. Accordingly, a pattern in which the row hammer refresh signal RHR is generated when the internal refresh signal IREF is activated four times, the row hammer refresh signal RHR is generated when the internal refresh signal IREF is subsequently activated three times, and the row hammer refresh signal RHR is generated when the internal refresh signal IREF is subsequently activated three times is repeated. When the predetermined value in the counter circuit 51 is set to 45, the counter circuit 51 is reset to zero and the row hammer refresh signal RHR is generated each time the count value Count reaches 45 as shown in FIG. 8B. Accordingly, a pattern in which the row hammer refresh signal RHR is generated when the internal refresh signal IREF is activated four times, the row hammer refresh signal RHR is generated when the internal refresh signal REF is subsequently activated four times, the row hammer refresh signal RHR is generated when the internal refresh signal IREF is subsequently activated four times, and the row hammer refresh signal RHR is generated when the internal refresh signal IREF is subsequently activated three times is repeated. In this way, the operation shown in FIG. 4B or 5B is realized.

Figure 9:
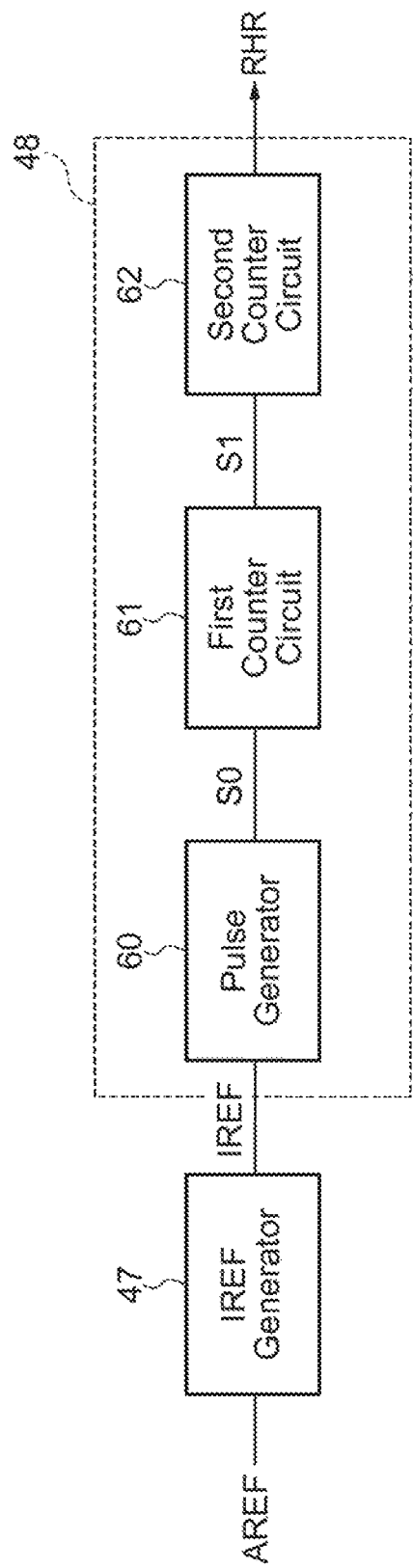
FIG. 9 is a block diagram showing a configuration of an average interval generator according to a second example.

In an example shown in FIG. 9, the average interval generator 48 is constituted by a pulse generator 60 and counter circuits 61 and 62. The pulse generator 60 generates the pulse signal S0 a plurality of times each time the internal refresh signal IREF is activated. The counter circuit 61 counts the pulse signals S0 and generates a pulse signal S1 each time the count value reaches a predetermined value. The counter circuit 62 counts the pulse signals S1 and activates the row hammer refresh signal RHR each time the count value reaches a predetermined value. The pulse generator 60 is same as the pulse generator 50 shown in FIG. 6 and activates the pulse signal S0 12 times each time the internal refresh signal IREF is activated. The predetermined value set in the counter circuit 61 is P and the predetermined value set in the counter circuit 62 is Q. It is possible to conversely set the predetermined value in the counter circuit 61 to Q and the predetermined value in the counter circuit 62 to P. For example, a circuit that uses a (n+1)-bit binary counter and resets the count value to zero we the count value reaches the predetermined value P or Q as shown in FIG. 7 can be used as the counter circuits 61 and 62.

When the predetermined values in the counter circuits 61 and 62 are set to 8 and 5, respectively, the count value is reset to zero and the pulse signal S1 is generated each time a count value Count1 in the counter circuit 61 reaches 8, and the count value is reset to zero and the row hammer refresh signal RHR is generated each time a count value Count2 in the counter circuit 62 reaches 5 as shown in FIG. 10A. Accordingly, an identical pattern to that in the example shown in FIG. 8A is repeated. When the predetermined values in the counter circuits 61 and 62 are set to 9 and 5, respectively, the count value is reset to zero and the pulse signal S1 is generated each time the count value Count1 in the counter circuit 61 reaches 9 and the count value is reset to zero and the row hammer refresh signal RHR is generated each time the count value Count2 in the counter circuit 62 reaches 5 as shown in FIG. 10B. Accordingly, an identical pattern to that in the example shown in FIG. 8B is repeated.

The average interval generator 48 shown in FIG. 9 has a configuration in which the counter circuit 61 having the predetermined value set to P and the counter circuit 62 having the predetermined value set to Q are connected in series. Therefore, when the number of values that can be taken as the value of P or the number of values that can be taken as the value of Q is greater, the circuit scale can be decreased as compared to the average interval generator 48 shown in FIG. 6.

The average number of times when the internal refresh signal IREF is activated each time the refresh signal AREF is activated once is not always an integer. For example, in an example shown in FIG. 11A, the internal refresh signal IREF is activated five times with respect to three in every four times of the refresh signal AREF, and the internal refresh signal IREF is activated four times with respect to one in every four times of the refresh signal AREF. In this case, the average number of times when the internal refresh signal IREF is activated each time the refresh signal AREF is activated once is 4.75. In an example shown in FIG. 11B, the internal refresh signal IREF is activated five times with respect to two in every four times of the refresh signal AREF, and the internal refresh signal REF is activated four times with respect to two in every four times of the refresh signal AREF. In this case, the average number of times when the internal refresh signal IREF is activated each time the refresh signal AREF is activated once is 45. In an example shown in FIG. 11C, the internal refresh signal IREF is activated five times with respect to one in every four times of die refresh signal AREF and the internal refresh signal IREF is activated four times with respect to three in every four times of the refresh signal AREF. In this case, the average number of times when the internal refresh signal IREF is activated each time the refresh signal AREF is activated once is 4.25.

Figure 6:
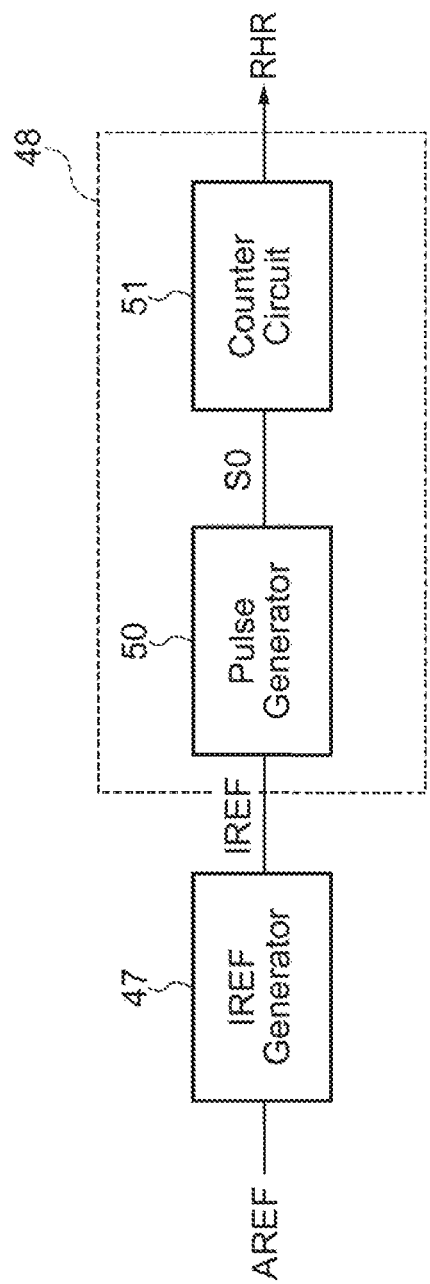
FIG. 6 is a block diagram showing a configuration of an average interval generator according to a first example.

In this case, it suffices to multiply the number of times when the pulse generator 50 generates the pulse signal S0 by four (set to 48, for example) and to set the predetermined value set in the counter circuit 51 to a value indivisible by 4 in the average interval generator 48 shown in FIG. 6. For example, when the number of times when the pulse generator 50 generates the pulse signal S0 is 48, it suffices to set the predetermined value set in the counter circuit 51 to 159 in the case shown in FIG. 11A, to 158 in the case shown in FIG. 11B, and to 157 in the case shown in FIG. 11C.

Figure 12:
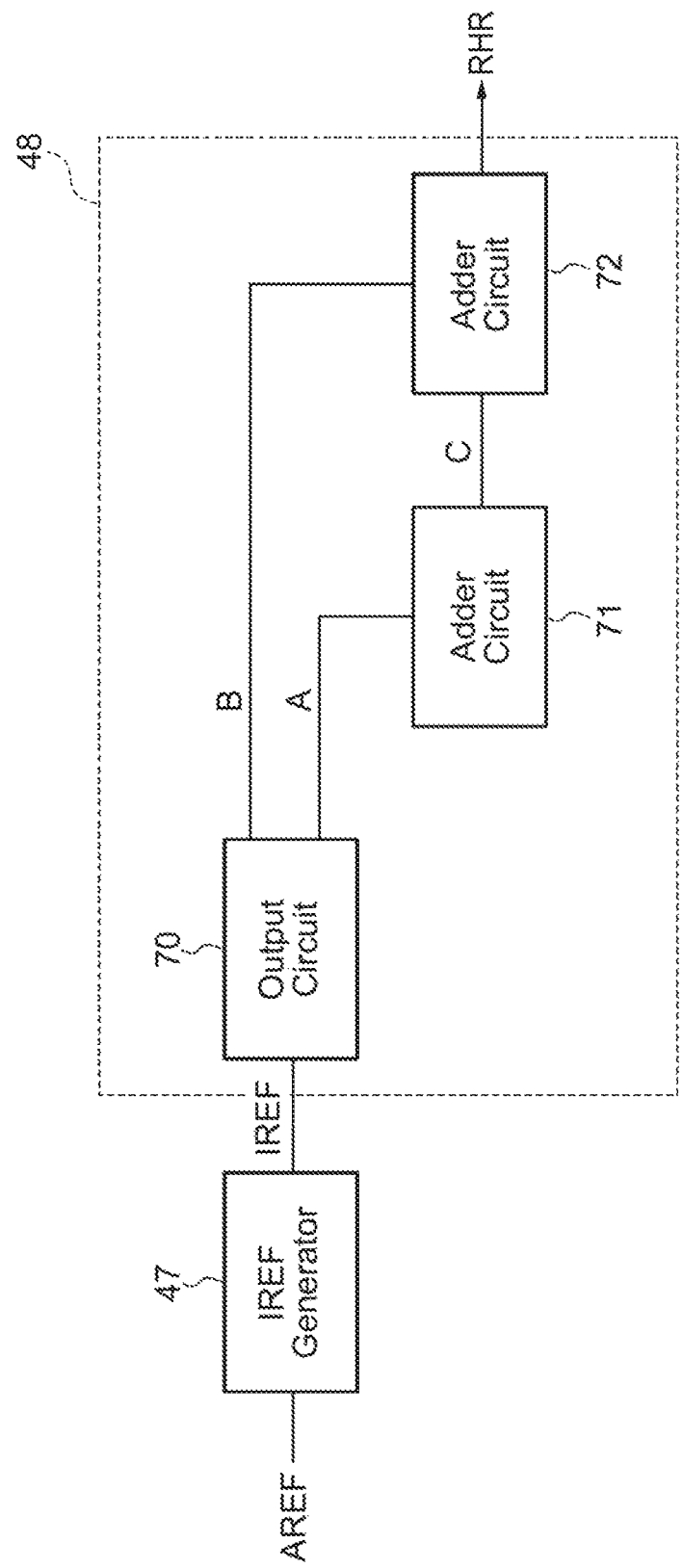
FIG. 12 is a block diagram showing a configuration of an average interval generator according to a third example.

The average interval generator 48 shown in FIG. 12 includes an output circuit 70 that outputs a remainder A and a quotient B each time the internal refresh signal IREF is activated, and adders 71 and 72. The adder 71 accumulates the remainder A, and is reset to zero and generates a carry C each time the accumulated value reaches the value P. The adder 72 accumulates the quotient B and the carry C, and is reset to zero and generates the row hammer refresh signal RHR each time the accumulated value reaches the value Q. The remainder A and the quotient B are values obtained by dividing a value twice as large as the number of the row addresses VADD stored in the row hammer address storing circuit 44 by P. When the addresses stored in the row hammer address storing circuit 44 are six addresses SEED1 to SEED6 as in the example described above, the remainder A and the quotient B are determined by 12/P. Therefore, A=4 and B=1 when P=8, and A=3 and B=1 when P=9. Accordingly, the accumulated value of the adder 71 is a same value as the count value Count1 shown in FIG. 10A or 10B, and the accumulated value of the adder 72 is a same value as the count value Count2 shown in FIG. 10A or 10B. Therefore, the row hammer refresh signal RHR is activated at a same timing as that in a case where the average interval generator 48 shown in FIG. 9 is used. When the average interval generator 48 shown in FIG. 12 is used, the circuit scale can be decreased and the current consumption can be reduced because there is no need to count many pulse signals S0.

Figure 11A:
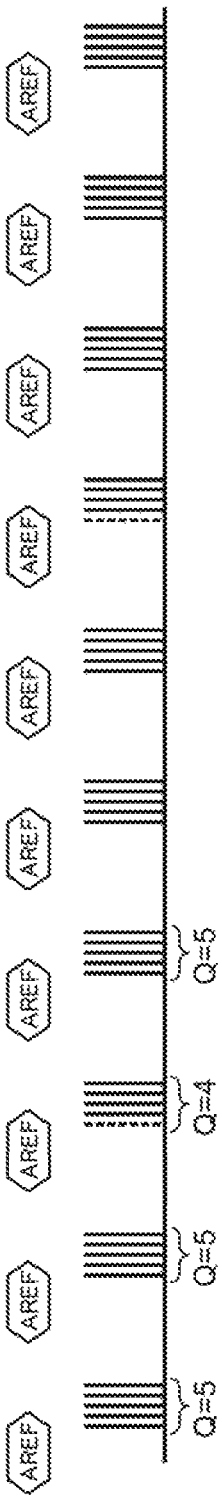
FIGS. 11A to 11C are timing charts showing an example in which the average number of times when the internal refresh signal is activated each time a refresh signal is activated once is not an integer.
Figure 11B:
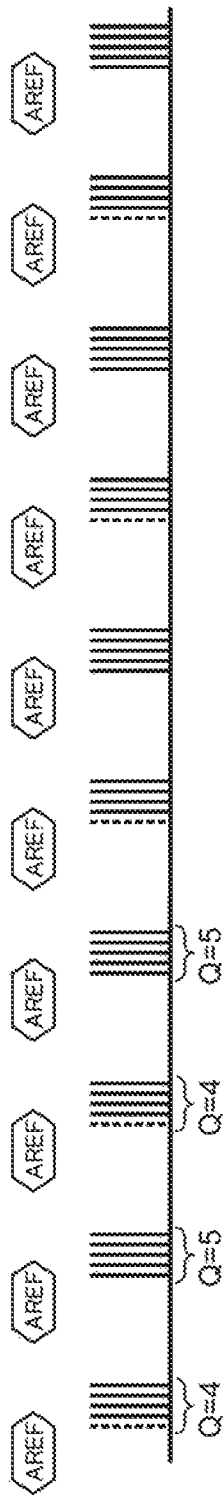
Figure 11C:
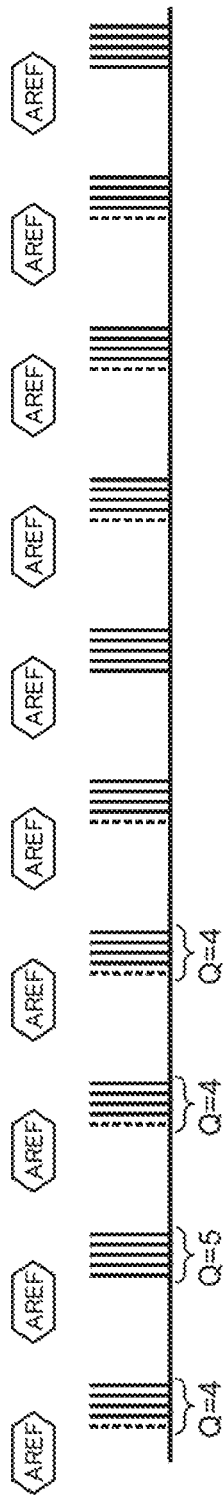

It is particularly effective to use the average interval generator 48 shown in FIG. 12 when the average number of times when the internal refresh signal IREF is activated each time the refresh signal AREF is activated once is not an integer as in the examples shown in FIGS. 11A to 11C. In this case, it suffices to set the remainder A and the quotient B to values obtained by dividing a value eight times as large as the number of the row addresses VADD stored in the row hammer address storing circuit 44 by P, and to set a value at which the adder 72 is reset to the number of the internal refresh signals IREF activated in response to four refresh signals AREF. For example, when P=8, values determined by 48/8 are the remainder A=0 and the quotient B=6. When P=9, values determined by 48/9 are the remainder A=3 and the quotient B=5. Further, it suffices to set the setting value in the adder 72 to 19 in the example shown in FIG. 11A, to 18 in the example shown in FIG. 11B, and to 17 in the example shown in FIG. 11C. In the case where the internal refresh signal IREF is always activated five times each time the refresh signal AREF is activated once as in the examples shown in FIGS. 4B and 5B, it suffices to set the setting value in the adder 72 to 20.

Figure 13:
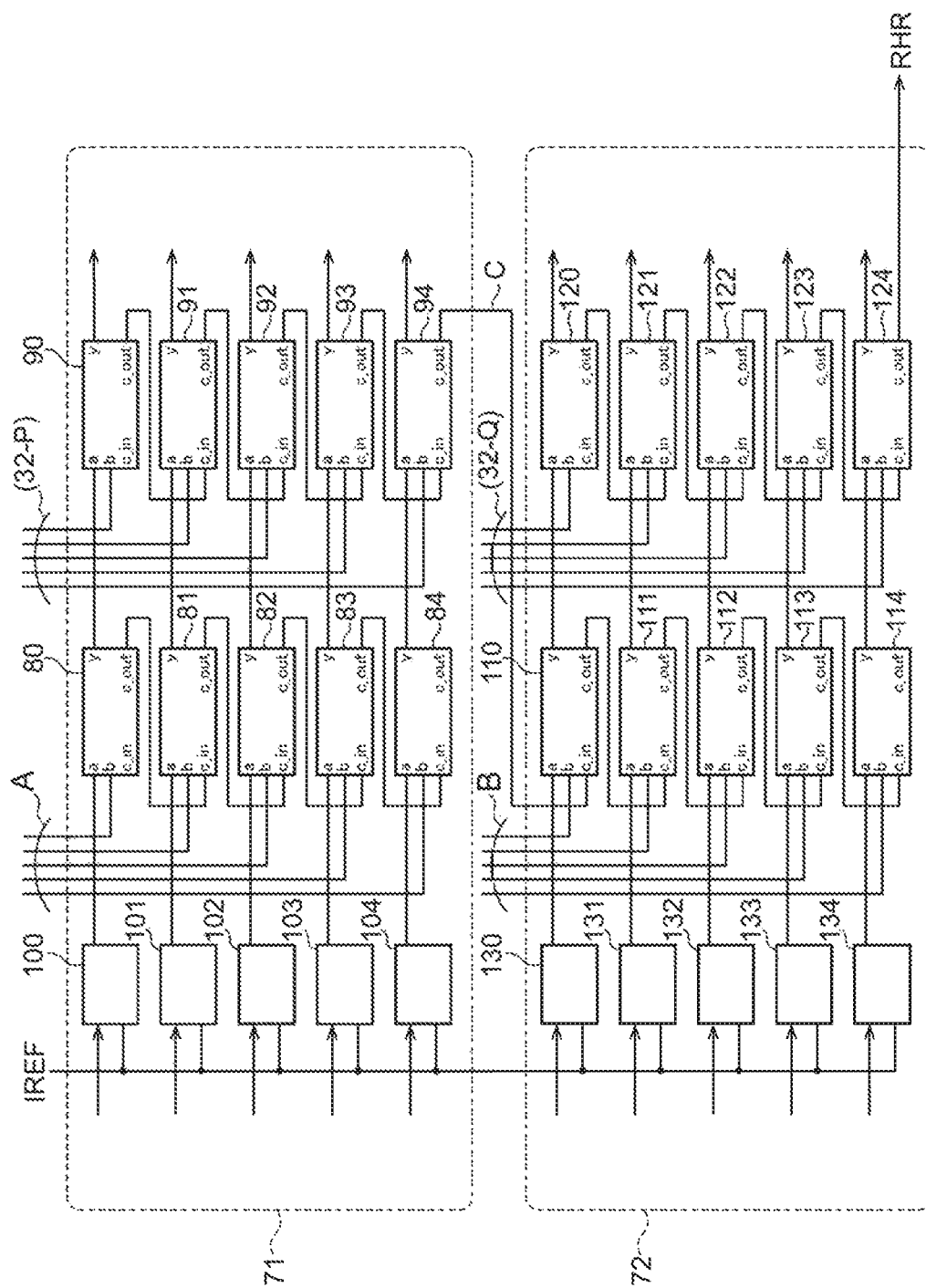
FIG. 13 is a circuit diagram of an adder shown in FIG. 12.
Figure 14:
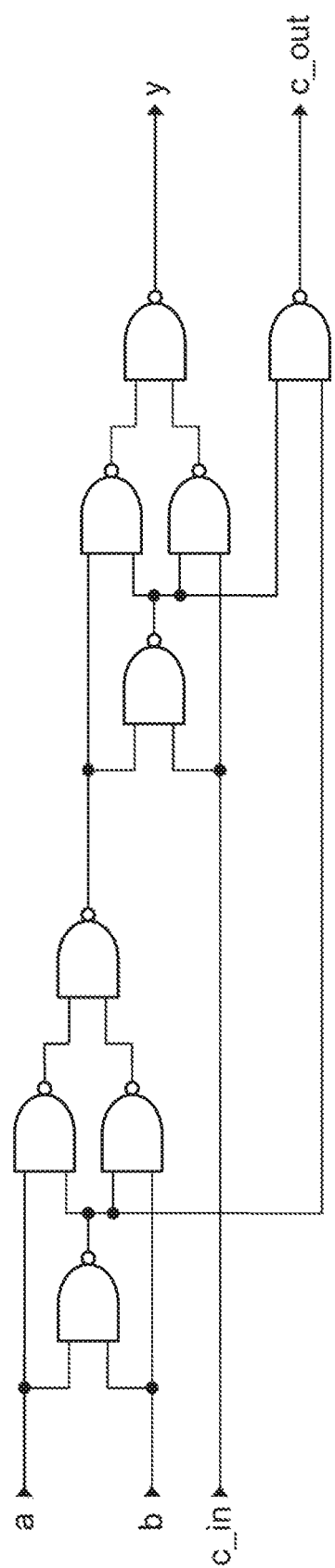
FIG. 14 is a circuit diagram of full adder circuits shown in FIG. 13.

FIG. 13 is a circuit diagram of the adders 71 and 72. In the example shown in FIG. 13, the adder 71 is constituted by full adder circuits 80 to 84 and 90 to 94 and latch circuits 100 to 104. A circuit configuration of the full adder circuits is as shown in FIG. 14. Bits input to nodes "a" and b are added and the resultant is output from a node y. When carrying occurs, the carry is output from a node c_out and is input to a node c_in of an upper-order full adder circuit. The full adder circuits 80 to 84 at the previous stage have a 5-bit configuration and add the remainder A to accumulated values stored in the latch circuits 100 to 104, respectively. The full adder circuits 90 to 94 at the subsequent stage have a 5-bit configuration and add accumulated values stored in the full adder circuits 80 to 84 at the previous stage to an initial value (32−P), respectively. The accumulated values stored in the full adder circuits 80 to 84 at the previous stage are fed back to the latch circuits 100 to 104 and are latched in response to the internal refresh signal IREF Similarly, the adder 72 is constituted by full adder circuits 110 to 114 and 120 to 124 and latch circuits 130 to 134. The full adder circuits 110 to 114 at the previous stage have a 5-bit configuration and add the quotient B to accumulated values stored in the latch circuits 130 to 134, respectively. The full adder circuits 120 to 124 at the subsequent stage have a 5-bit configuration and add accumulated values stored in the full adder circuits 110 to 114 at the previous stage to an initial value (32−Q), respectively. The accumulated values stored in the full adder circuits 110 to 114 at the previous stage are fed back to the latch circuits 130 to 134 and are latched in response to the internal refresh signal IREF. In this example, when the internal refresh signal REF is always activated five times each time the refresh signal AREF is activated once, the value Q is 20 (=five times×4) and the initial value for the full adder circuits 120 to 124 at the subsequent stage is 12. Meanwhile, in the examples shown in FIGS. 11A to 11C, the values Q are 19, 18, and 17, respectively, and the initial values for the full adder circuits 120 to 124 at the subsequent stage are 13, 14, and 15, respectively.

With this configuration, each time the internal refresh signal IREF is activated, the remainder A is added to values of the full adder circuits 80 to 84 at the previous stage and the quotient B is added to the values of the full adder circuits 110 to 114 at the previous stage. In the adder 71, when the values of the full adder circuits 80 to 84 at the previous stage reach P, the values of the full adder circuits 90 to 94 at the subsequent stage are reset to zero and the carry C is produced. In the adder 72, when the values of the full adder circuits 110 to 114 at the previous stage reach Q, the values of the full adder circuits 120 to 124 at the subsequent stage are reset to zero and the row hammer refresh signal RHR is generated.

With use of the adders 71 and 72 having the circuit configurations described above, the circuit scale can be decreased and the count operation can be performed rapidly.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a first circuit configured to generate a first signal a first numerical value of times in response to an input signal;
a second circuit configured to generate a second signal having a second numerical value each time the first signal is activated; and
a third circuit configured to receive the second signal to update a count value obtained by accumulating the second numerical value, configured to generate a third signal each time the count value reaches a third numerical value, and configured to update the count value obtained by accumulating the second numerical value and subtracting the third numerical value when the count value reached the third numerical value.

2. The apparatus of claim 1, wherein the second circuit is configured to generate the second signal a plurality of times that is the same as the second numerical value each time the first signal is activated.

3. The apparatus of claim 2, wherein the third numerical value is greater than the second numerical value.

4. The apparatus of claim 3, wherein the third numerical value is indivisible by the second numerical value.

5. The apparatus of claim 4, wherein the third numerical value is divisible by the first numerical value.

6. The apparatus of claim 2, wherein the third circuit includes a counter circuit configured to update the count value each time the second signal is activated.

7. The apparatus of claim 6, wherein the count value of the counter circuit is reset to an initial value each time the count value of the counter circuit reaches the third numerical value.

8. The apparatus of claim 2,
wherein the third circuit includes:
a first counter circuit configured to update a first count value each time the second signal is activated; and
a second counter circuit configured to update a second count value each time the first count value reaches a fourth numerical value, and
wherein the third signal is generated each time the second count value reaches a fifth numerical value.

9. The apparatus of claim 8,
wherein the first count value of the first counter circuit is reset to an initial value each time the first count value of the first counter circuit reaches the fourth numerical value, and
wherein the second count value of the second counter circuit is reset to an initial value each time the second count value of the second counter circuit reaches the Eh numerical value.

10. The apparatus of claim 9, wherein the third numerical value is equal to a product of the fourth numerical value and the fifth numerical value.

11. The apparatus of claim 1, wherein the second signal includes a fifth signal having a sixth numerical value and a sixth signal having a seventh numerical value.

12. The apparatus of claim 11,
wherein the third circuit includes:
a third counter circuit configured to accumulate the sixth numerical value each time the filth signal is activated; and
a fourth counter circuit configured to accumulate the seventh numerical value each time the sixth signal is activated, and configured to be incremented when a count value of the third counter circuit reaches an eighth numerical value, and
wherein the third signal is generated each time a count value of the fourth counter circuit reaches a ninth numerical value.

13. The apparatus of claim 1,
wherein the input signal is activated in response to a refresh command, and
wherein the first signal is an internal refresh signal.

14. The apparatus of claim 13, wherein the third signal is a row hammer refresh signal.

15. An apparatus comprising:
a pulse generator configured to generate a first pulse signal a first number of times in response to an input signal;
a first counter circuit configured to update a first count value each time the first pulse signal is activated and configured to generate a second pulse signal and to reset the first count value to an initial value each time the first count value reaches a first predetermined value; and
a second counter circuit configured to update a second count value each time the second pulse signal is activated and configured to generate a third pulse signal and to reset the second count value to an initial value each time the second count value reaches a second predetermined value,
wherein the first number and at least of one the first and second predetermined values are indivisible by each other.

16. The apparatus of claim 15, wherein the first number and a product of the first and second predetermined values are indivisible by each other.

17. The apparatus of claim 15, wherein the first predetermined value and the second predetermined value are indivisible by each other.

18. The apparatus of claim 15,
wherein the first pulse signal is an internal refresh signal, and wherein the third pulse signal is a row hammer refresh signal.

19. An apparatus comprising:
an output circuit configured to generate a first signal indicating a first numeral value and a second signal indicating a second numeral value;
a first adder circuit configured to update a first count value by accumulating the first numerical value each time a first pulse signal is activated and configured to generate a carrier signal and to reset the first count value to an initial value each time the first count value reaches a first predetermined value, and
a second adder circuit configured to update a second count value by accumulating the second numerical value each time the first pulse signal is activated, configured to increment the second count vale in response to the carrier signal, and configured to generate a second pulse signal and to reset the second count value to an initial value each time the second count value reaches a second predetermined value.

20. The apparatus of claim 19,
wherein the first pulse signal is an internal refresh signal, and
wherein the second pulse signal is a row hammer refresh signal.

\* \* \* \* \*

UNITED STATES PATENT AND TRADEMARK OFFICE
CERTIFICATE OF CORRECTION

| | |
|---|---|
| PATENT NO. | : 11,356,081 B2 |
| APPLICATION NO. | : 16/563334 |
| DATED | : June 7, 2022 |
| INVENTOR(S) | : Hidekazu Noguchi |

It is certified that error appears in the above-identified patent and that said Letters Patent is hereby corrected as shown below:

In the Claims

| | Reads | Should Read |
|---|---|---|
| Column 10, Line 13 | "reaches the Eh numerical value" | -- reaches the fifth numerical value -- |
| Column 10, Line 24 | "each time the filth signal" | -- each time the fifth signal -- |
| Column 11, Line 16 | "second count vale" | -- second count value -- |

Signed and Sealed this
Ninth Day of August, 2022

Katherine Kelly Vidal
Director of the United States Patent and Trademark Office